US012591010B2

(12) United States Patent
Schaper et al.

(10) Patent No.: US 12,591,010 B2
(45) Date of Patent: Mar. 31, 2026

(54) DEVICE AND METHOD FOR IDENTIFYING WEAR OF AN ELECTROMECHANICAL DEVICE

(71) Applicant: PHOENIX CONTACT GMBH & CO. KG, Blomberg (DE)

(72) Inventors: Elmar Schaper, Lügde (DE); Peter Scholz, Brakel (DE); Fabian Winkel, Paderborn (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 120 days.

(21) Appl. No.: 18/557,780

(22) PCT Filed: Apr. 27, 2022

(86) PCT No.: PCT/EP2022/061237
§ 371 (c)(1),
(2) Date: Oct. 27, 2023

(87) PCT Pub. No.: WO2022/229274
PCT Pub. Date: Nov. 3, 2022

(65) Prior Publication Data
US 2024/0426910 A1     Dec. 26, 2024

(30) Foreign Application Priority Data

Apr. 30, 2021    (BE) .................................. 2021/5335

(51) Int. Cl.
G01R 31/327         (2006.01)
(52) U.S. Cl.
CPC ..... G01R 31/3274 (2013.01); G01R 31/3278 (2013.01)

(58) Field of Classification Search
None
See application file for complete search history.

(56) References Cited

U.S. PATENT DOCUMENTS 6,199,018 B1 *  3/2001  Quist ................. G05B 23/0221
                                                      706/912
6,917,203 B1 *  7/2005  Perotti ................... G01R 31/72
                                                        324/546

(Continued)

FOREIGN PATENT DOCUMENTS

CN      111310314 A      6/2020
DE      20310043 U1     11/2004

(Continued)

OTHER PUBLICATIONS

The State Intellectual Property Office of People's Republic of China, The Second Office Action for corresponding CN Application No. 201980080741.6 mailed Jun. 1, 2024 [18 pgs].

(Continued)

*Primary Examiner* — Jas A Sanghera
(74) *Attorney, Agent, or Firm* — QUARLES & BRADY LLP

(57)            ABSTRACT

The present invention relates to a device for identifying wear of an electromechanical device, the device comprising: a measuring device, which is configured to detect at least one predetermined operating parameter of the electromechanical device; and an evaluation device, which is configured to determine a current operating state of the electromechanical device from the detected predetermined operating parameter of the electromechanical device by means of machine learning with the aid of mass data, preferably in the form of training data.

19 Claims, 13 Drawing Sheets

(56) References Cited

U.S. PATENT DOCUMENTS

| | | |
|---|---|---|
| 10,895,608 B2 | 1/2021 | Narayanasamy et al. |
| 2017/0268960 A1* | 9/2017 | Jaramillo-Velasques .................... G01M 13/02 |
| 2017/0364800 A1* | 12/2017 | Kiranyaz ............... G06N 3/084 |
| 2018/0174768 A1 | 6/2018 | Remy et al. |
| 2019/0272479 A1 | 9/2019 | Mars et al. |
| 2020/0012270 A1 | 1/2020 | Hollender et al. |
| 2021/0117787 A1 | 4/2021 | Stal et al. |
| 2021/0124342 A1* | 4/2021 | Shukla ............... G05B 23/0283 |
| 2021/0286995 A1* | 9/2021 | Zhu ..................... G01M 13/045 |
| 2022/0284278 A1* | 9/2022 | Tang ........................ G06N 3/08 |

FOREIGN PATENT DOCUMENTS

| | | |
|---|---|---|
| DE | 102010041998 A1 | 4/2012 |
| DE | 102013219243 A1 | 3/2015 |
| DE | 102016124083 A1 | 6/2018 |
| DE | 102018114425 A1 | 12/2019 |
| DE | 102018221270 A1 | 6/2020 |
| EP | 3745229 A1 | 12/2020 |
| EP | 3764179 A1 | 1/2021 |
| WO | 2017091966 A1 | 6/2017 |
| WO | 2020115313 A1 | 6/2020 |

OTHER PUBLICATIONS

PCT International Search Report and Written Opinion, PCT/EP2022/061237, Aug. 19, 2022, 15 pages.

* cited by examiner

F2B

F2C coil current
at switch-on process

F2A

F2D coil current
at switch-off process

DEVICE AND METHOD FOR IDENTIFYING WEAR OF AN ELECTROMECHANICAL DEVICE

CROSS REFERENCE TO RELATED APPLICATIONS

This application represents the United States national stage entry of PCT International Application PCT/EP2022/061237 filed on Apr. 27, 2022 and published under Publication No. WO/2022/229274 A1 on Nov. 3, 2022, which PCT International Application claims the benefit of priority to Belgium Application No. BE2021/5335 filed on Apr. 30, 2021, both of which are incorporated herein by reference in their entirety for all purposes.

TECHNICAL FIELD

The present invention relates to systems for monitoring a wear behavior.

In particular, the present invention relates to a device and method for identifying wear of an electromechanical device.

TECHNICAL BACKGROUND

In the course of predictive maintenance, it is important to know the condition of electromechanical switching elements such as electromechanical relays or contactors or electromechanical valves—in particular also hydraulic and or pneumatic actuators—and to replace the used or worn actuator or switching element already before a possible failure in order to avoid standstill or downtime.

In safety-relevant applications, for example according to the IEC61508 or ISO13849 standards, continuous condition monitoring of actuators or switching elements can be even more important.

DE 10 2010 041 998 A1 describes a method for predicting the operational capability of a relay or a contactor. A current flowing through the relay or contactor and/or a voltage applied to the relay or contactor is repeatedly measured, and the measured values are transmitted to an observation unit. The observation unit makes a prediction about the operational capability based on the measured values and a model.

DE 10 2018 114 425 A1 and DE 10 2010 041 998 A1 describe systems that enable monitoring of the contact side of an electromechanical relay. Consequently, only faulty behavior can be detected with these systems.

In DE 10 2013 219 243 B4, an estimation of the aging of the contacts of a relay is made via a current-dependent counter. The service life of relays depends to a large extent on the impedance of the load to be switched, the voltage applied and the current. Since only one of the factors can be considered with the approach, successful estimation of the aging appears to be limited.

possible.

U.S. Pat. No. 10,895,608 B2 describes a device and method for detecting the movement of a plunger of the electromagnet includes detecting a spike in a current signal applied to a coil of the electromagnet. A predetermined threshold value is added to the current signal applied to the coil of the solenoid to produce a level-shifted signal. The level-shifted signal and the peak signal are compared to detect the movement of a plunger of the solenoid.

SUMMARY OF THE INVENTION

It is a task of the present invention to provide an improved device and an improved method for identifying wear of an electromechanical component.

This task is solved by the objects of the independent claims. Further implementations and embodiments are to be taken from the dependent claims, the description and the figures of the drawings.

In this context, the term "wear" of the electromechanical component may comprise an anomaly of the electromechanical component or normal or continuous abrasion. The term "wear" of the electromechanical component may thereby also include aging. In this regard, the term "wear" may also include an imminent spontaneous failure.

A first aspect of the present invention relates to a device for identifying wear of an electromechanical device, the device comprising: a measuring device, which is configured to detect at least one predetermined operating parameter of the electromechanical device; and an evaluation device, which is configured to determine a current operating state of the electromechanical device from the detected predetermined operating parameter of the electromechanical device on the basis of machine learning with the aid of mass data, preferably in the form of training data.

The present invention makes it possible to determine the state of electromechanical actuators, and to replace used or worn actuators even before an imminent, possible failure, in order to minimize downtime or prevent the occurrence of downtime or avoid other malfunctions.

The present invention is intended to provide predictive maintenance of electromechanical actuators with the aid of machine learning methods. Electromechanical actuators are used, for example, in the form of relays or valves as a link between the control and process levels and are therefore of critical importance to the operation of a plant.

The present invention enables aging of an electromechanical actuator to be reliably determined with minimal measurement effort.

The present invention enables artificial intelligence methods, such as machine learning or such as artificial neural nets, also artificial neural networks, to make predictions and/or estimates about current measurement data based on training data used in a learning process.

So-called "deep learning" methods define, for example, a class of optimization methods of artificial neural networks that have numerous hidden layers between the input layer and the output layer and thus have an extensive internal structure.

This advantageously allows that no manual feature extraction or definition of supervised features is needed. Therefore, precise predictions can be made if the models are trained with mass data, in English also "Big Data", in the form of training data, where here also a marking of the training data with state data of the electromechanical switching devices can take place, i.e. referenced or labeled.

The present invention describes a device for monitoring electromechanical actuators, wherein the device comprises a measuring device and an evaluation device, with which conclusions are drawn about the state of the electromechanical actuator with the aid of machine learning methods.

This device is intended to enable predictive maintenance of electromechanical actuators in order, on the one hand, to plan maintenance over the long term and, on the other hand, to be able to react to changes in condition at short notice. In this way, possible failures of the actuators can be prevented by maintenance and, for example, the availability of the plant can be increased.

For the operator of a plant, this results in both economic and ecological benefits.

The latter can be generated by avoiding faulty production and maximum utilization of the actuators. In addition, continuous monitoring of the actuators can increase the safety of systems.

In the neural network, however, no direct comparison of the switching cycles with each other is carried out, but through optimization procedures in the training process, the procedure itself has learned or optimized the internal parameters so that relevant features characteristic of abrasion are implicitly contained in the neural network and thus predictions can be output for current unknown input data.

In one embodiment of the present invention, the neural network implemented in the evaluation device has been trained beforehand and, by evaluating current measurements, is able to infer the current state of the currently installed actuator, for example a relay, to determine the state of abrasion.

Advantageous embodiments of the present invention can be found in the subclaims.

In an advantageous embodiment of the present invention, it is provided that the evaluation device is configured to train an estimator with operating data on different rates of wear for the machine learning and to use the trained estimator for determining the current operating state of the electromechanical device.

In an advantageous embodiment of the present invention, it is provided that the estimator is configured as a classification estimator and/or regression estimator.

In an advantageous embodiment of the present invention, it is provided that the estimator comprises a deep neural network comprising convolutional layers and recurrent layers.

In an advantageous embodiment of the present invention, it is provided that the evaluation device is configured to determine the current operating state from the detected predetermined operating parameter assuming a multimodal failure distribution, preferably the evaluation device is configured to determine the current operating state from the detected predetermined operating parameter via a plurality of target variables, particularly preferably the plurality of target variables corresponding to a multimodal failure distribution.

In an advantageous embodiment of the present invention, it is provided that the evaluation device is configured to train a classification and regression estimator with run-to-failure data for the machine learning, and to use the classification and regression estimator for determining the current operating state of the electromechanical device.

In an advantageous embodiment of the present invention, it is provided that the classification and regression estimator comprises a deep neural network comprising convolutional layers and recurrent layers.

In an advantageous embodiment of the present invention, it is provided that the measuring device is further configured to add to the detected at least one predetermined operating parameter of the electromechanical device further information in the form of a time stamp or a counter reading.

In an advantageous embodiment of the present invention, it is provided that the measuring device is further configured to continuously detect the operating parameter of the electromechanical device or to detect the operating parameter only upon a switching event of the electromechanical device.

In an advantageous embodiment of the present invention, it is provided that the evaluation device is configured to further determine predictions about a future operating state of the electromechanical device.

In an advantageous embodiment of the present invention, it is provided that the evaluation device is configured to determine the current operating state or the predictions about the future operating state of the electromechanical device after a time period has elapsed or triggered by a trigger event.

In an advantageous embodiment of the present invention, it is provided that as predictions:

a remaining usable lifetime as a relative proportion of the total lifetime of the electromechanical device;

a remaining usable lifetime as an absolute proportion of cycles or time of use of the electromechanical device;

a risk probability for a spontaneous failure of the electromechanical device;

a typification of the electromechanical device;

a coefficient for a load or a classification of a load of the electromechanical device;

a binary-coded error message;

a binary-coded operational readiness; and/or process-related information of the electromechanical device.

In an advantageous embodiment of the present invention, it is provided that the evaluation device is configured to be integrated into a holding device for the electromechanical device.

In an advantageous embodiment of the present invention, it is provided that the device further comprises a display device which is preferably configured to display the current operating state of the electromechanical device.

In an advantageous embodiment of the present invention, it is provided that the at least one predetermined operating parameter of the electromechanical device comprises an actuating force, or a pressure shock of a fluid, thereby triggering another movement process of the armature, a counterforce, an actuating travel, an overtravel, a switching point, a light pulse, an arc, an acoustic signal, a magnetic field, a temperature, a coil current, a coil voltage, a contact current, a load current or a contact voltage; and/or wherein the mass data comprises any operating parameters, and the any operating parameters comprise an actuation force, a counterforce, an actuation travel, an overtravel, a switching point, a light pulse, an arc, an acoustic signal, a magnetic field, a temperature, a coil current, a coil voltage, a contact current, a load current, or a contact voltage of the electromechanical device.

In an advantageous embodiment of the present invention, it is provided that the measuring device is configured to detect the arbitrary operating parameters as characteristic curves based on a preliminary measurement during an initialization phase of the electromechanical device.

In a second aspect of the present invention, a method for identifying wear of an electromechanical device is provided, the method comprising the following method steps:

As a first method step, a detection of at least one predetermined operating parameter of the electromechanical device is performed by means of a measuring device.

As a second method step, a current operating state of the electromechanical device is determined by means of a machine deep learning method with the aid of mass data, preferably in the form of training data, from the detected predetermined operating parameter of the electromechanical switching device by means of an evaluation device.

According to a third aspect, the present invention comprises a computer program or computer program product comprising instructions which, when the program is executed by a computer, cause the computer to execute the steps of the method according to the second aspect or any embodiment of the second aspect.

According to a fourth aspect, the present invention comprises a computer-readable storage medium comprising instructions that, when executed by a computer, cause the computer to execute the steps of the method according to the second aspect or any embodiment of the second aspect.

The described embodiments and further embodiments may be combined with each other as desired.

Other possible embodiments, further embodiments and implementations of the present invention also include combinations of features of the present invention described previously or hereinafter with respect to the embodiments that are not explicitly mentioned.

The accompanying drawings are intended to provide a further understanding of embodiments of the present invention.

The accompanying drawings illustrate embodiments and, in connection with the description, serve to explain concepts of the present invention.

Other embodiments and many of the advantages mentioned will be apparent with reference to the figures of the drawings. The elements shown in the figures of the drawings are not necessarily shown to scale with respect to each other.

BRIEF DESCRIPTION OF THE FIGURES

It shows.

DETAILED DESCRIPTION OF THE EMBODIMENTS

In the figures of the drawings, like reference signs denote like or functionally identical elements, parts, components or process steps, unless otherwise indicated.

The term "artificial neural network" as used by the present invention includes, for example, a computer network based on a collection of interconnected units or nodes called artificial neurons that model neurons in a biological brain.

The term "recurrent neural network" as used by the present invention includes, for example, a neural network characterized by connections from neurons of one layer to neurons of the same or a previous layer, in contrast to a normal network, also referred to as a feedforward network, where connections between nodes form a directed graph along a temporal sequence.

Figure 1:
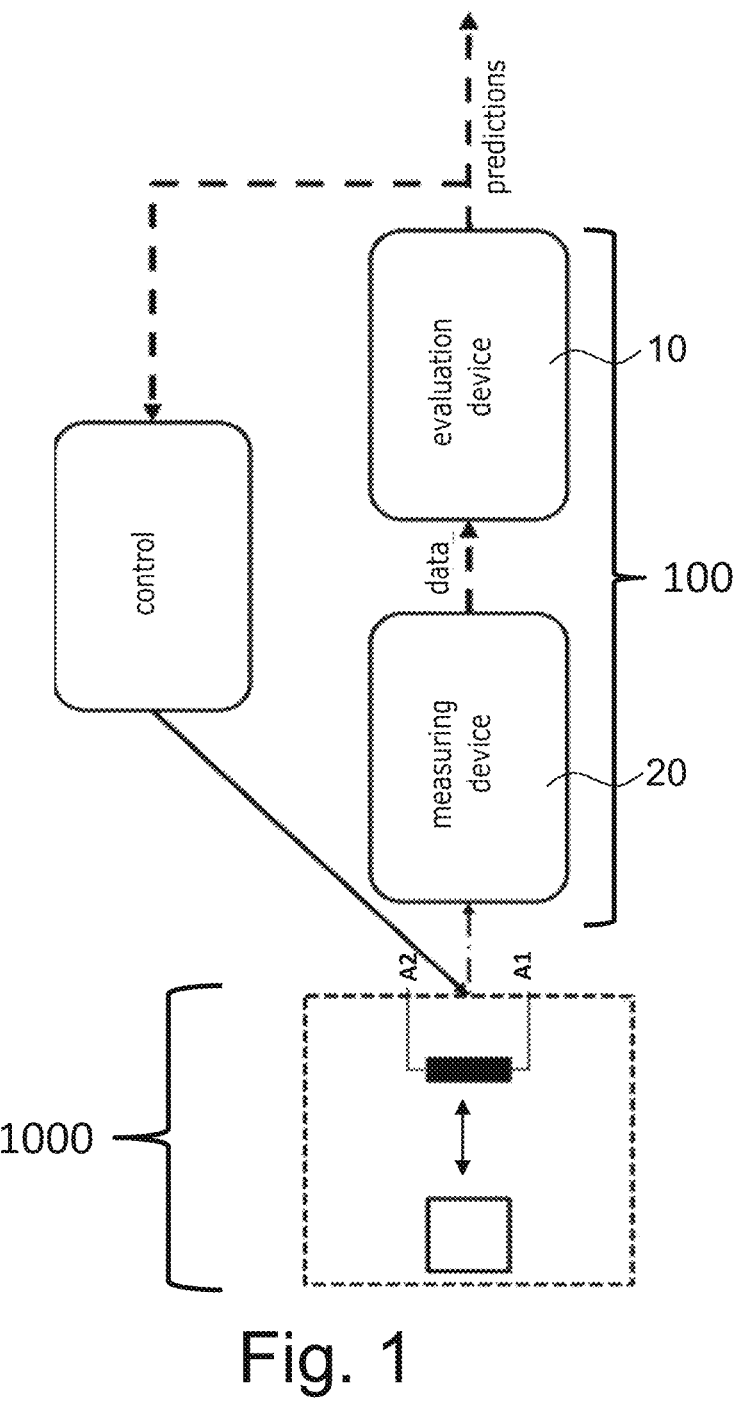
FIG. 1: a schematic representation of a measurement setup of the method according to the invention outlined according to an embodiment example of the present invention.

FIG. 1 shows a schematic representation of a measurement setup of the inventive method outlined according to an embodiment of the present invention.

FIG. 1 shows a sketch of the measurement setup of the method according to the invention. An electromechanical actuator includes a coil to which a voltage can be applied via contacts A1 and A2. As soon as a voltage is applied to the coil, a current begins to flow through the coil and a magnetic field is established.

Through this magnetic field, a force is exerted on another component, whereby, depending on the actuator and application, a defined state is caused.

The present invention has the advantage that the state of the electromechanical actuator can be inferred from the state variables of the coil. This is explained using the example of an electromechanical relay. For this purpose, state variables of the coil, such as coil current and coil voltage, are detected over the entire lifetime of electromechanical relays.

The present invention has the advantage that measurements can also be made only at the actuator, e.g. only the contact voltage and/or the contact current.

In addition, other characteristics such as the determination of the switching time point can also be measured via other electrical circuits.

In this case, a corresponding measuring circuit can be used, in which a special circuit technique can be used to determine at any time which switching state the contacts of a relay have.

The assumption is that the measurements of the measured variables contain information that indicates the abrasion of the relay. The measured variables are detected digitally by one or more measuring devices, and further information such as time stamps or counter readings can also be added.

The data can be continuously available or updated only during switching events. For example, the contact voltage can only be transmitted when there is also a switching event.

The updated data is used to make predictions about the state of the electromechanical actuator using at least one machine learning method.

Processing of the data can be triggered both after a time barrier is exceeded and by events, such as the application of a voltage.

Possible machine learning predictions include:

Remaining usable lifetime as a relative proportion of the total lifetime

Remaining usable lifetime as absolute number of usable cycles or time.

Risk of spontaneous failure as a percentage

Electromechanical actuator typification.

Coefficient for load or classification of load of the actuator (Especially feedback in case of overload from the actuator, reasons can be system design errors as well as defects of other system components).

Binary error message.

Binary operational readiness.

Process-related information, such as a temperature of the actuator.

Figure 2:
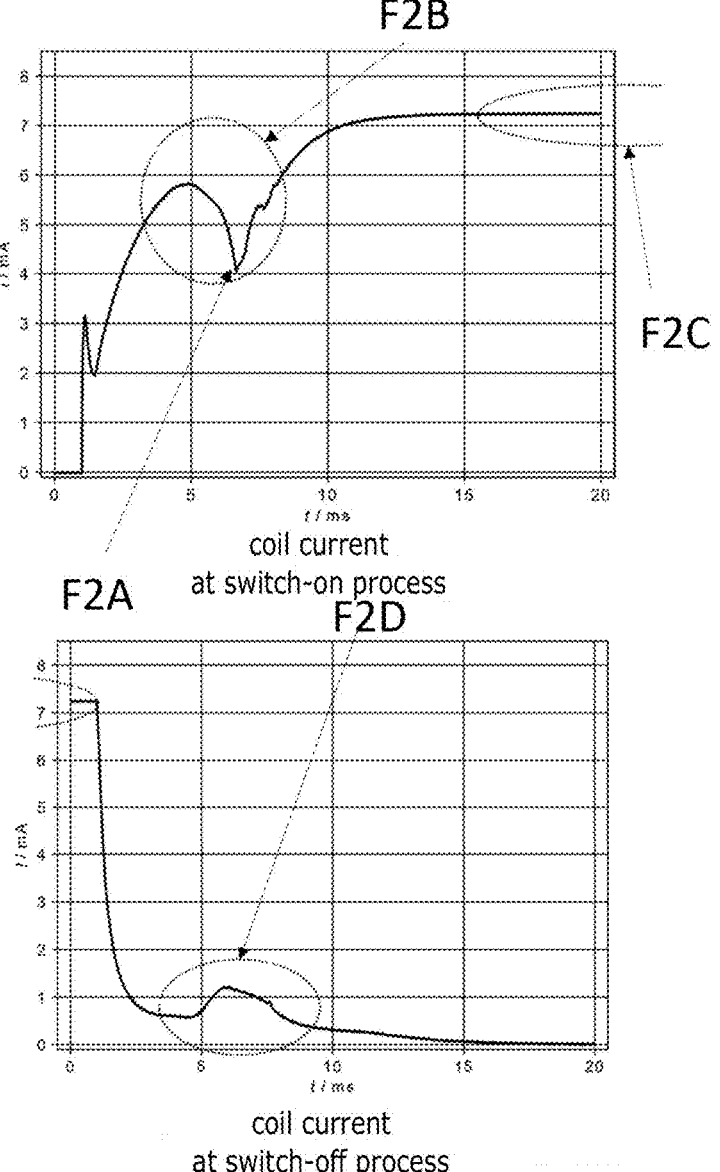
FIG. 2: a schematic representation of a coil current for an switch-on/-off operation of an electromechanical relay according to an embodiment of the present invention.

FIG. 2 shows a schematic representation of a coil current for a switch-on or switch-off process of an electromechanical relay according to an embodiment of the present invention.

In FIG. 2, the coil current for a switch-on or switch-off process of an electromechanical relay is shown as an example.

In the following figures, this state variable is analyzed as an example for electromechanical relays.

When switching on, it can be seen that the current behaves according to a real coil and increases accordingly from 1 ms to about 4 ms. From about 5 ms on, the current decreases, which can be explained by the fact that a magnetic armature is moved by the magnetic field of the coil and thus changes the remanence of the magnetic circuit. The latter leads to the observable reduction of the current.

After a few milliseconds the anchor reaches its end position, where the remanence is no longer changed and the current can increase again according to a real coil. The reaching of the end position can be identified as a local minimum.

Consequently, the coil current at switch-on contains a lot of information about the electromechanical actuator including the movement speed, movement period, temperature, armature impact and 'counter forces' after the impact.

For switch-off, it can be seen that the current initially drops according to a real coil. However, starting at about 3 ms, an increase in current can be observed; here, current is induced by the armature moving back to its rest position. After the local maximum, the current drops again according to a real coil. Thus, the coil current contains a lot of relevant information about the electromechanical actuator even when it is switched off.

Finally, this consideration shows that the coil current, which is only one state variable, contains a lot of information relevant to the state of a relay.

The present invention is intended to use this information as black box modeling using machine learning techniques to predict the state of the electromechanical actuators.

In region F2A in FIG. 2, an armature appliance of electromechanical device 1000 is shown.

In area F2B in FIG. 2, it is shown that the magnetic field of the coil in the actuator moves an armature, which in turn changes the remanence of the coil and thus the current flow (dip of the current).

In the area F2C in FIG. 2 is shown:

At constant voltage, the coil current can be used to infer the coil temperature and thus the actuator temperature.

In area F2D in FIG. 2 is shown the following.

The armature is moved to its rest position after switching off the supply voltage wherein a current is induced in the coil.

Figure 3:
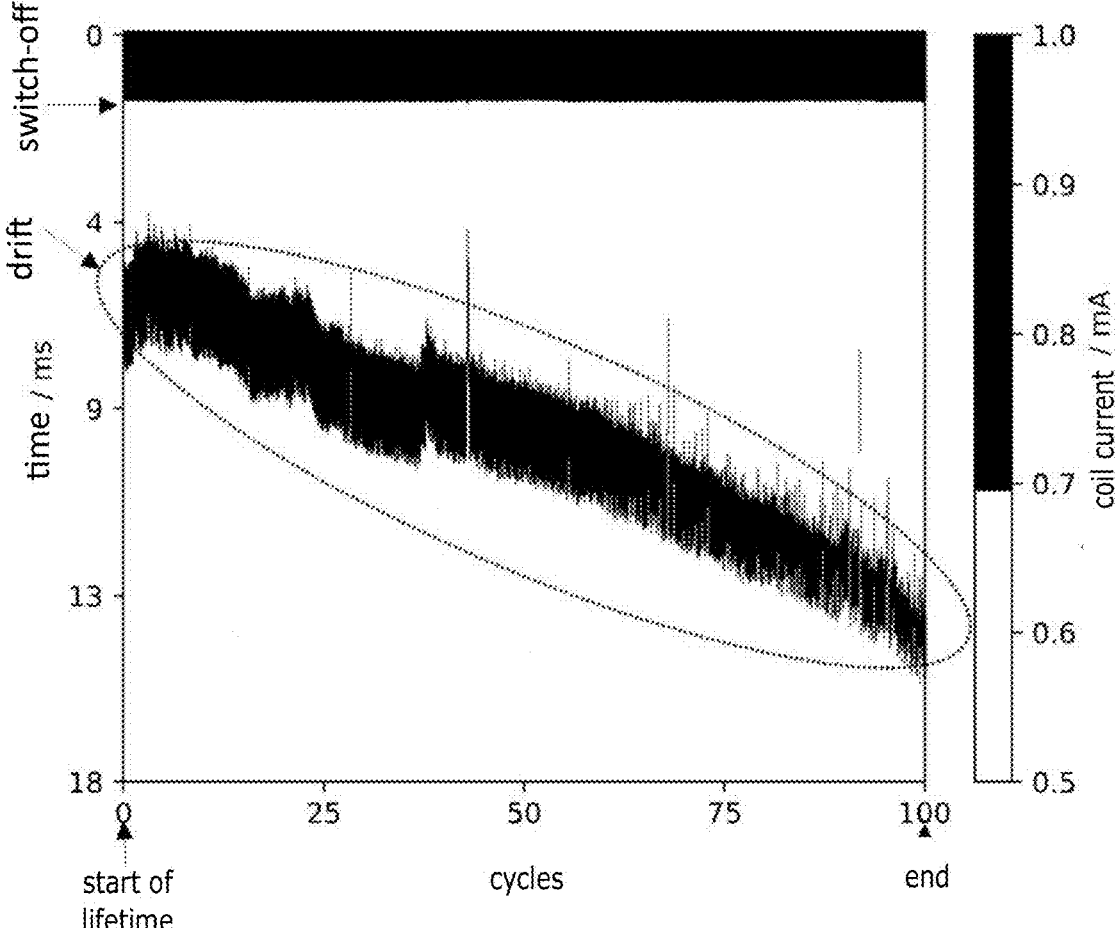
FIG. 3: a schematic representation of a coil current of a relay in the switch-off process exemplarily over the entire lifetime according to an embodiment of the present invention.

FIG. 3 shows a schematic representation of a coil current of a relay in the switch-off process exemplarily over the entire lifetime according to an embodiment of the present invention.

FIG. 3 shows the coil current of a relay in the switch-off process exemplarily over the entire lifetime. The relay was aged under realistic conditions in a fully automatic test setup with a standardized inductive load (DC13). It is representative of relays that exhibit continuous degeneration as described in other patents. Specifically, it can be seen that the induced current occurs later and less as the lifetime increases. Accordingly, an estimate of the remaining lifetime of an electromechanical actuator would be possible via this information.

Figure 4:
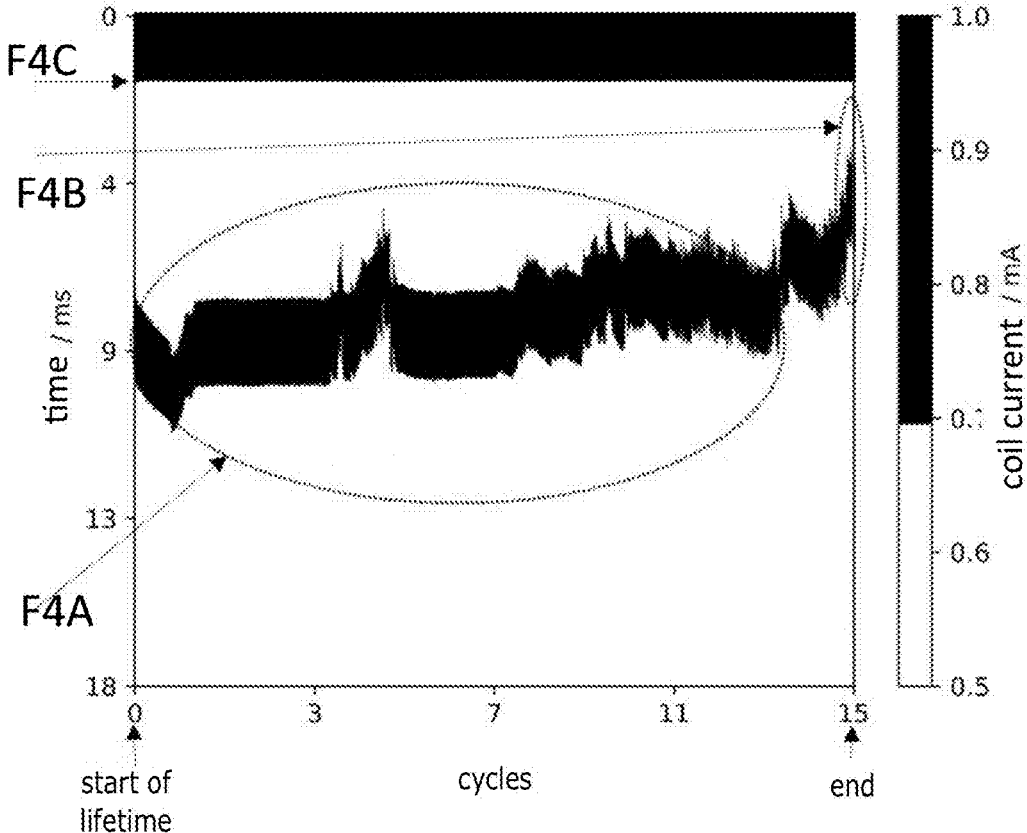
FIG. 4: a schematic representation of a coil current of a relay in the switch-off process exemplarily over the entire lifetime according to an embodiment of the present invention.

FIG. 4 shows a schematic representation of a coil current of a relay in the switch-off process exemplarily over the entire lifetime according to an embodiment of the present invention.

FIG. 4 shows the coil current of a relay in the switch-off process exemplarily over the entire lifetime. The relay was aged under realistic conditions in a fully automatic measurement setup with a standardized load (DC13). It is representative of the relays that exhibit spontaneous failure.

Compared with FIG. 3, it can be seen that the time at which the current is induced is initially approximately constant and only slight local deviations can be detected. Only for a short time before the failure of the relay a sudden change of the time can be observed. This anomaly in the shape of the current is indicative of an impending failure of the relay. Consequently, in the context of the present invention, the coil current would allow an estimate of the risk of failure of an electromechanical actuator.

In region F4A in FIG. 4, it is shown that there is an induced current with no trend.

In area F4B in FIG. 4 it is shown that a spontaneous strong change in the coil current, also called an anomaly, is present.

In area F4C in FIG. 4, the start of the switch-off process is shown.

Figure 5:
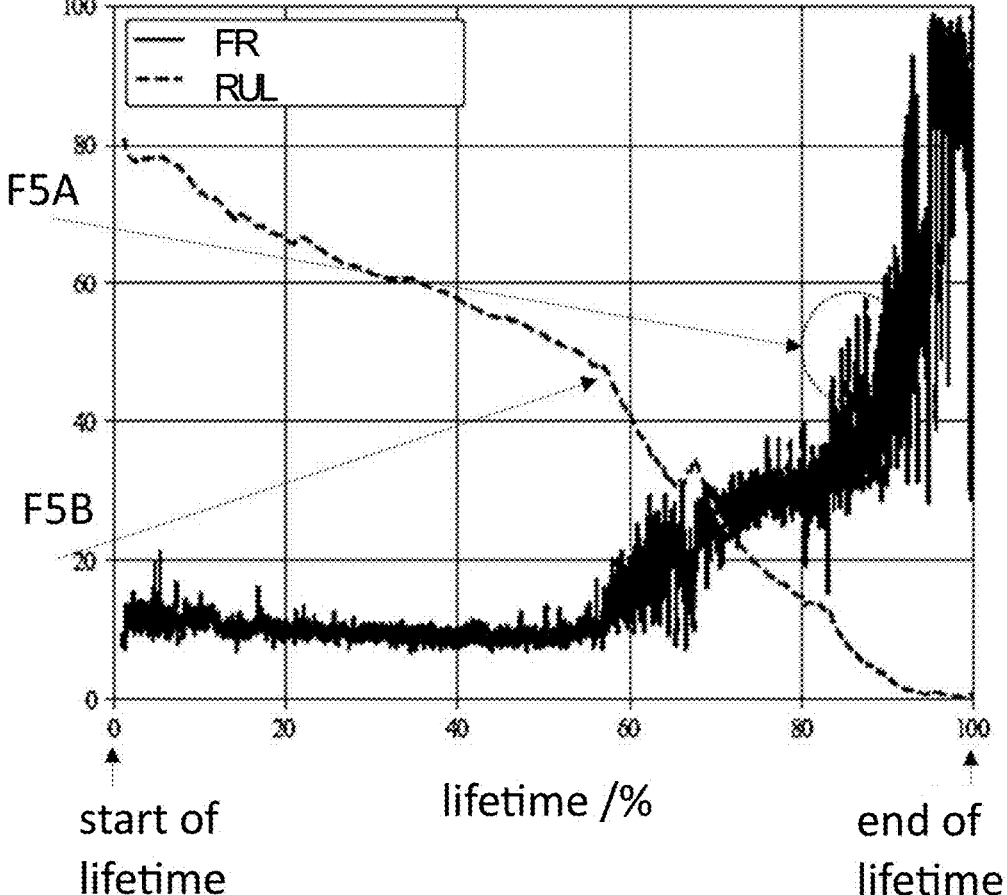
FIG. 5: a schematic representation of a diagram containing predictions for a relay over its entire lifetime in accordance with an embodiment of the present invention.

FIG. 5 shows a schematic representation of a diagram containing the predictions for a relay throughout its lifetime according to an embodiment of the present invention.

FIG. 5 shows the predictions for a relay over its entire lifetime. This is a relay that exhibits continuous degeneration. The predictions are the result of a machine learning process that has been given the aforementioned state variables as input.

First, the remaining life is estimated as the relative proportion of the remaining switching cycles to the total switching cycles; this quantity can be used to perform long-term maintenance planning, since a degeneration rate can be determined from the predictions and thus the remaining cycle(s) or time can be calculated. Furthermore, the failure risk is estimated, e.g. short-term abnormal changes of the coil current shape are used.

This target value is suitable to initiate maintenance measures at short notice in order to prevent a failure of the actuator and thus of the plant.

In area F5A in FIG. 5 the following is shown.

A replacement notice is given due to a failure risk >50%.

In area F5B in FIG. 5 the following is shown.

Long-term planning of maintenance due to remaining service life (from the predictions a rate of degeneration can be can be calculated to approximate the time or cycles to failure.

Figure 6:
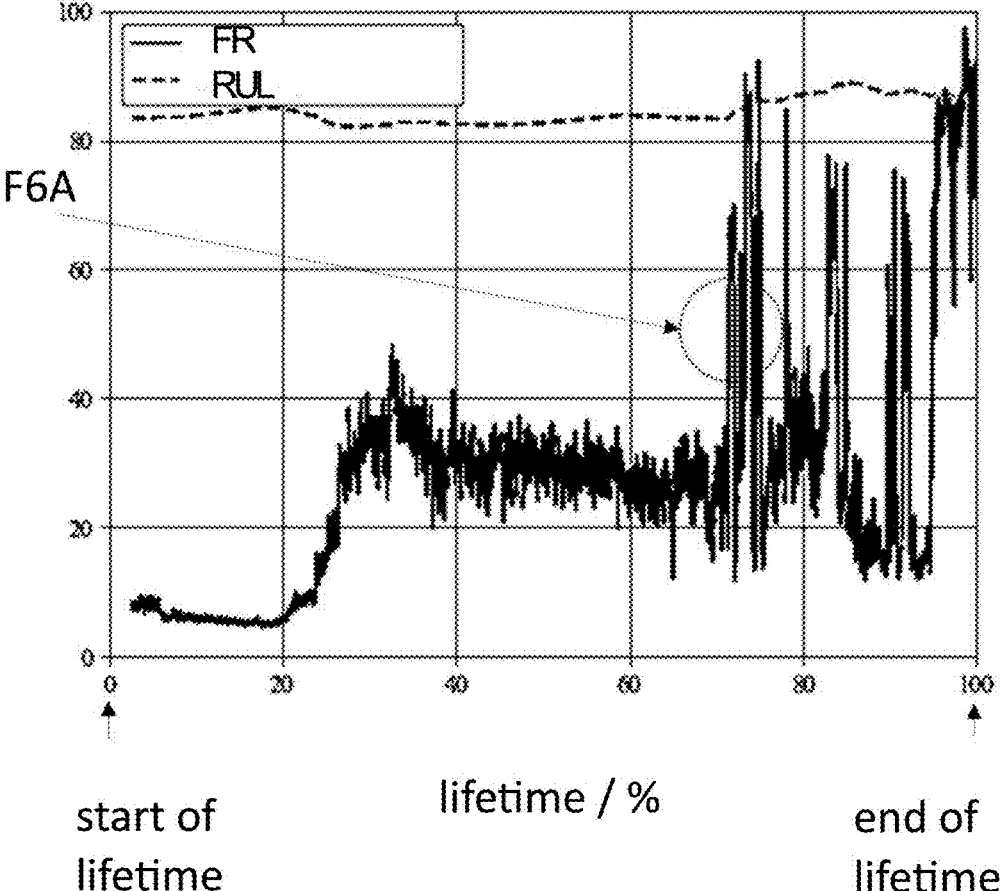
FIG. 6: a schematic representation of a diagram containing the predictions for a relay over its entire lifetime according to an embodiment of the present invention.

FIG. 6 shows a schematic representation of a diagram containing the predictions for a relay over its entire lifetime according to an embodiment of the present invention.

FIG. 6 shows the predictions for a relay over its entire lifetime. This is a relay that exhibits spontaneous failure. The predictions are the result of the same machine learning procedure used for FIG. 5. Both predictions need to be differentiated at this point.

The remaining lifetime is estimated to be more than 80% over the whole lifetime. Long-term maintenance planning based on this prediction is not possible in this case. Physically, this observation can be justified by the fact that the relay did not fail due to long-term degeneration, but that a short-term effect, such as sticking of the contacts, led to the failure.

Such an effect cannot be detected in the long term and predictions of remaining life are therefore useless. At this point, the risk of failure can be used, because before the end of the relay's life, this target value is considered to be particularly high. Timely maintenance can be performed on the basis of this quantity.

In area F6A in FIG. 6 the following is shown.

There is a replacement indication for the electromechanical device 1000 due to a failure risk >50% based on the current operating state of the electromechanical device 1000.

Figure 7:
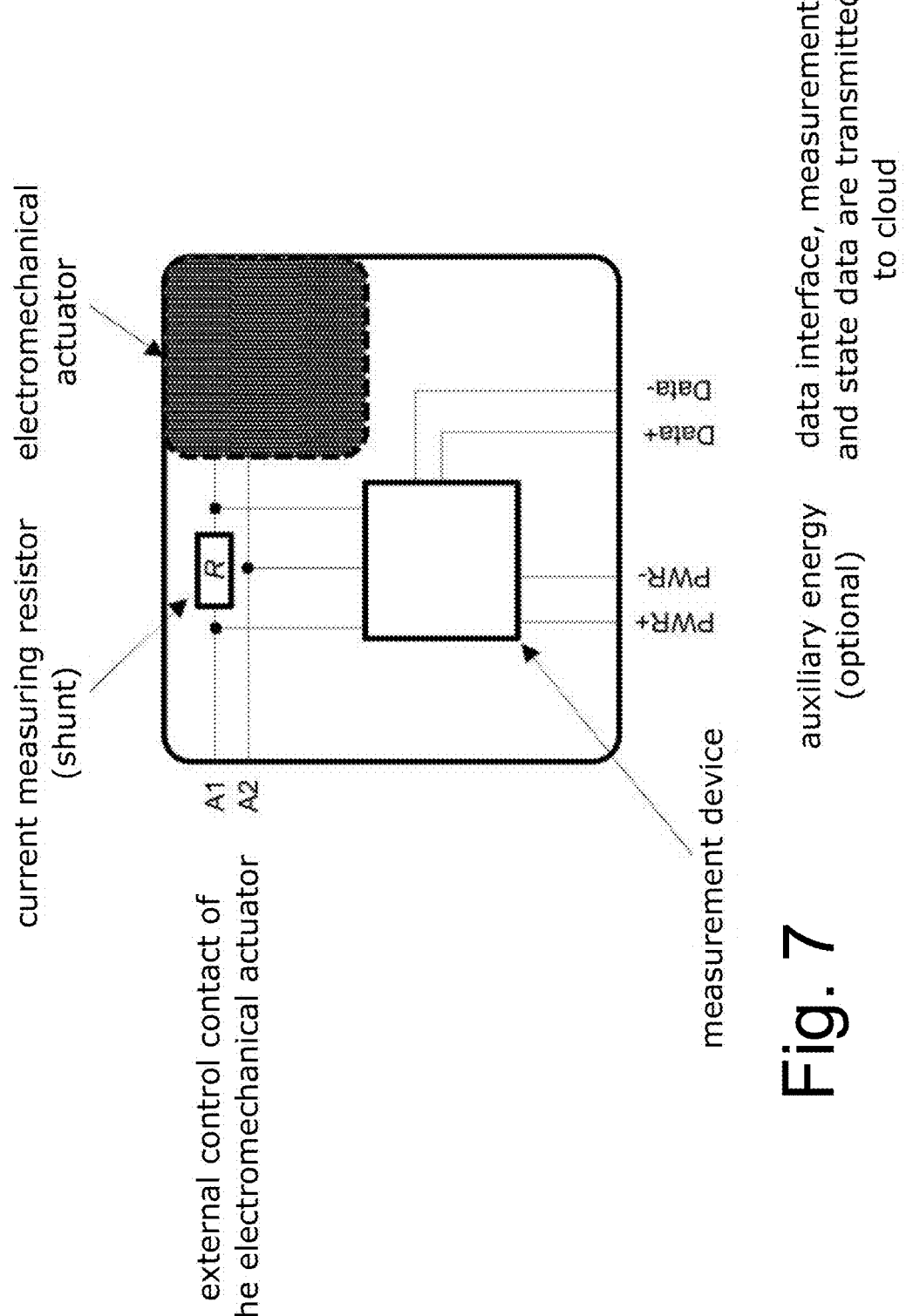
FIG. 7: a schematic representation of a device according to an embodiment of the present invention.

FIG. 7 shows a schematic representation of a device according to an embodiment of the present invention.

FIG. 7 outlines a minimal example of a structure according to the invention. Here, a relay socket is used, which converts the coil current into a voltage via a measuring resistor (shunt), which is detected digitally via a measuring device and forwarded via an interface (Data+ Data−). Additional data can be added such as time stamps, temperatures, etc. The auxiliary power can either be added externally (PWR+ PWR−) or it can be tapped from the coil drive signal at A1 and A2.

If this case is selected, it must be ensured that the power supply is only guaranteed if a voltage is also present at the terminals A1 and A2. If necessary, energy would have to be stored temporarily via a buffer capacitor in order to be able to transmit the data even after a measurement process.

In this minimal example, the evaluation device is executed externally as software in another module or in the cloud. The machine learning inputs are obtained through the previously described interface.

Optionally, a feedback channel is provided to visually display the state at the relay socket or to allow interventions in the control system.

Figure 8:
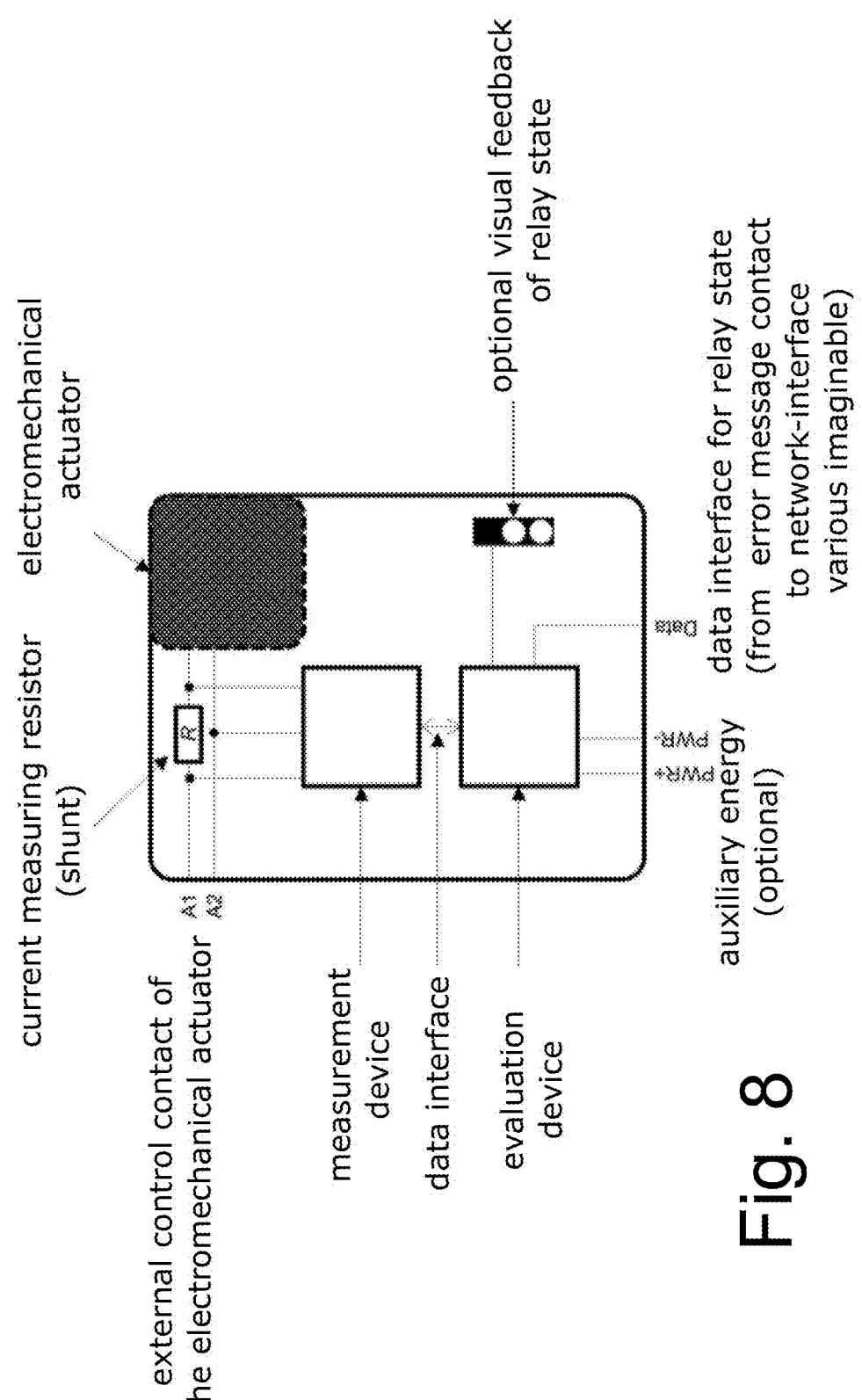
FIG. 8: a schematic representation of a stand-alone relay socket according to an embodiment of the present invention.

FIG. 8 shows a schematic representation of a stand-alone relay socket according to an embodiment of the present invention.

In FIG. 8, a stand-alone relay socket is outlined, which includes both the measuring device and the evaluation device. There is an optional display that can be used to visualize, for example, the following cases:

Class 1: New product
Class 2: Worn product
Class 3: Failure risk high

In this embodiment it can be useful that the inserted relay is "married" with the relay socket, e.g. already directly after production and before delivery of the product to the customer some switching cycles are run through and the neural network receives a "fine tuning" exactly for this relay.

If a new relay is later inserted into the socket, the neural network could be re-trained for the new relay, for example, at short notice. This can be done in a so-called initialization phase.

In one embodiment of the present invention, it is further provided that additional information about the relay (e.g., manufacturer code) is manually entered into the relay socket, via an additional data interface, in order to improve the prediction of the neural network.

The additional optional data interface may be useful to provide information about the state of the relay to a higher-level network. It is also conceivable that "updates" are transmitted into the relay socket via the interface.

Figure 9:
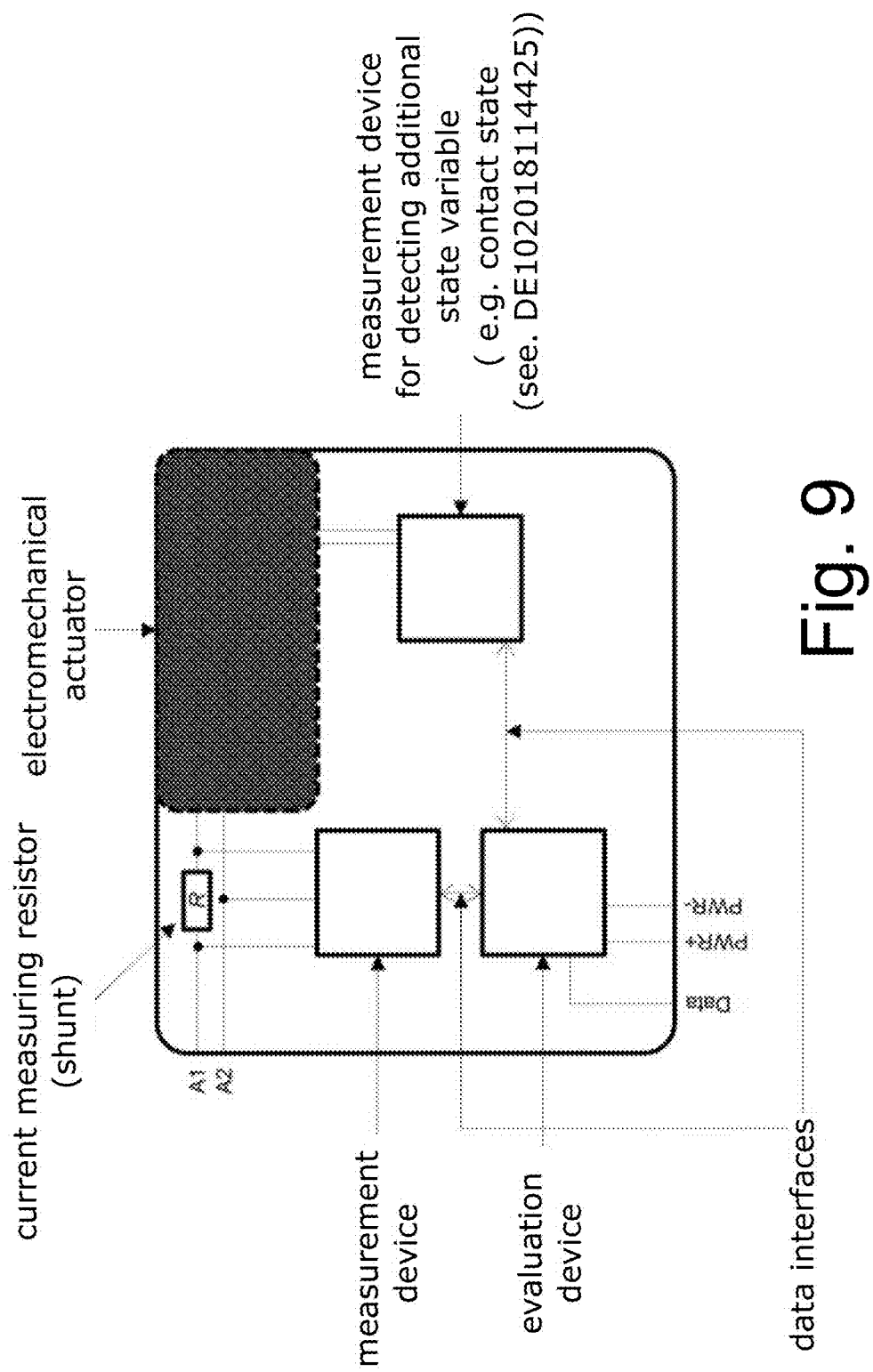
FIG. 9: a schematic representation of a modification of the relay socket of FIG. 8 according to an embodiment of the present invention.

FIG. 9 shows a schematic representation of a modification of the relay socket of FIG. 8 according to an embodiment of the present invention.

FIG. 9 shows a modification of the relay socket from FIG. 8 in such a way that it is shown that, in addition to the coil current, other measurement technology can also be integrated in the relay socket. The possibilities are manifold and briefly described in FIG. 9. It can be envisaged that appropriate circuit technology can be used advantageously to obtain information on the switching time of the contact without having to carry out complex direct measurement technology on the contact side.

Figure 10:
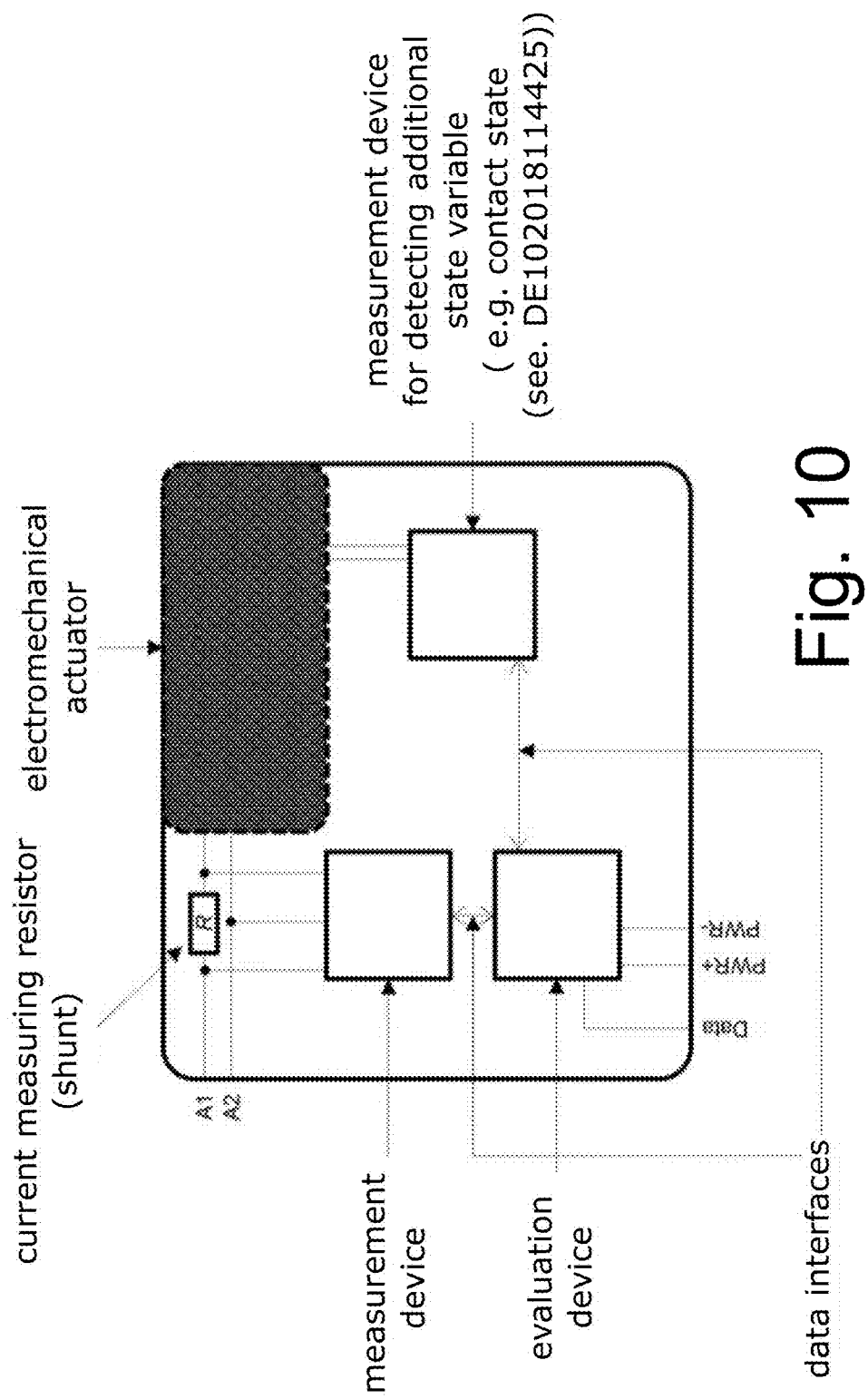
FIG. 10: a schematic representation of an arrangement in which a plurality of relay sockets are interconnected via a local communication bus, in accordance with an embodiment of the present invention.

FIG. 10 shows a schematic representation of an arrangement in which a plurality of relay sockets are interconnected via a local communication bus, according to an embodiment of the present invention.

In FIG. 10, several relay sockets are interconnected via a local communication bus and the individual measurement data of the relay sockets are managed by a central head module. The evaluation device can be placed in the head module, so that several electromechanical actuators share an evaluation device. This approach is particularly cost-efficient. The head module can be equipped with a further data interface to communicate data externally.

Furthermore, in an embodiment of the present invention, it is provided that the head module only collects and/or preprocesses the data of the individual relays and that part of the evaluation device is executed externally as software.

Figure 11:
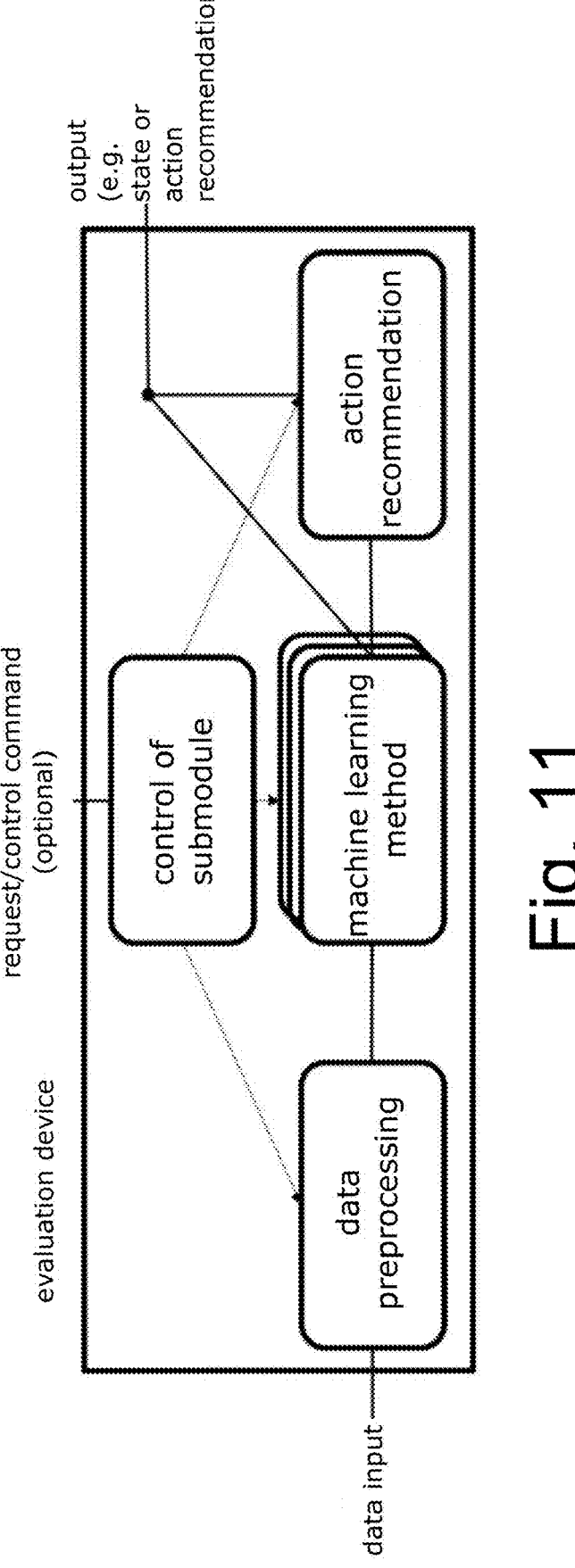
FIG. 11: shows the operation of the evaluation device according to an embodiment of the present invention.

FIG. 11 shows the operation of the evaluation device according to an embodiment of the present invention.

FIG. 11 shows the operation of the evaluation device. There are three subsystems, all of which are executable as pure software and thus can be executed on any terminal devices, from microprocessors to servers of a cloud to local computers, various systems are provided for execution in different embodiments of the present invention.

Data is fed to the evaluation device, such as time series of coil current and voltage and associated metadata. These data must first be preprocessed in a module set up for this purpose, such as a data preprocessing module, so that the data are standardized or outliers are eliminated.

Machine learning is then used to predict the above outputs. Presented is this step with multiple modules lined up, as different machine learning techniques may be required for the outputs.

Finally, the predictions are used in the action recommendation module to make specific action recommendations, such as 'change actuator'.

Figure 12:
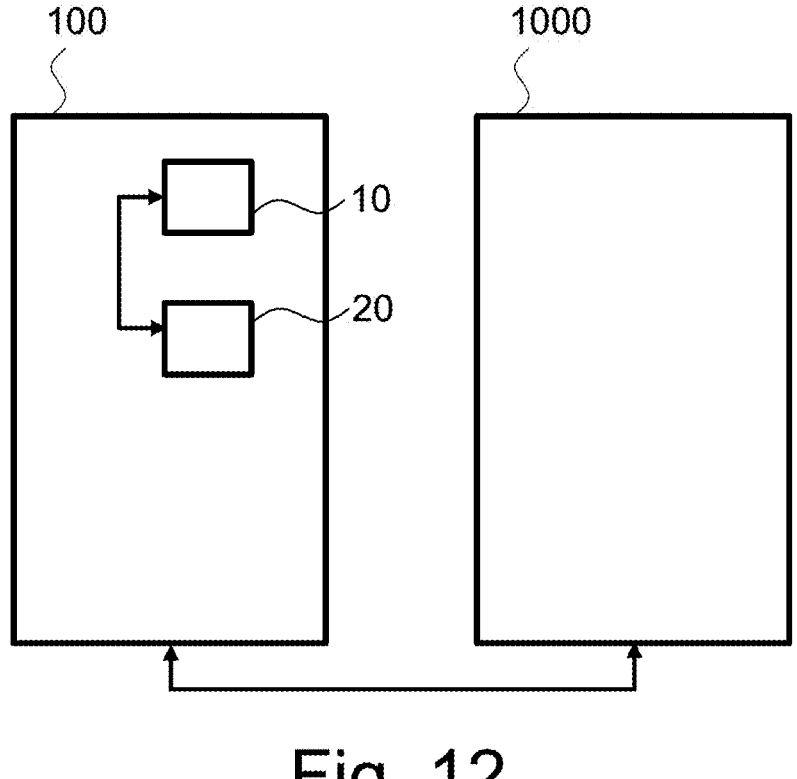
FIG. 12: a schematic representation of a device for identifying wear of an electromechanical device, in accordance with an embodiment of the present invention.

FIG. 12 shows a schematic diagram of a device 100 for identifying wear of an electromechanical device 1000 according to an embodiment of the present invention.

The device 100 comprises a measuring device 10 and an evaluation device 20.

The measuring device 10 is configured to detect at least one predetermined operating parameter of the electromechanical device 1000.

The evaluation device 20 is configured to determine a current operating state of the electromechanical device from the detected predetermined operating parameter of the electromechanical device by means of machine learning with the aid of mass data, preferably in the form of training data.

The present method enables to provide an abrasion identification, i.e. a monitoring of a wear or wear behavior of an electromechanical device or an electromechanical switching device.

The measuring device 10 is configured, for example, as a measuring device for detecting an operating parameter, such as an event, i.e., for example, a switching operation of the electromechanical device, a temperature increase of the electromechanical device, or even a removal or failure of the electromechanical device in the form of the relay.

The measuring device 10 is configured, for example, as a measuring device for detecting a curve and/or one or more characteristic variables of the event.

The evaluation device 20 is configured, for example, to perform an assignment of digital representative data to the current event or the current operating parameter.

Furthermore, an input of the representative data and/or of the training data and/or of state data into the artificial neural network may be performed.

The event or the operating parameter can be, for example, a coil current at the switch-on moment, or several electrical or physical variables can be combined to form an operating parameter, such as coil current and contact voltage. The operating parameter can also be a calculated value such as a determined overtravel.

Figure 13:
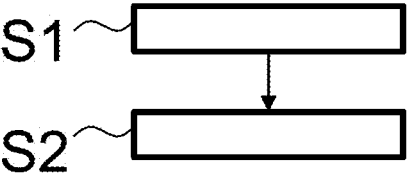
FIG. 13: a schematic diagram of a flowchart of a method for identifying wear of an electromechanical device according to an embodiment of the present invention.

FIG. 13 shows a schematic diagram of a flow chart of a method for identifying wear of an electromechanical device according to an embodiment of the present invention.

As a first method step, a detection S1 of at least one predetermined operating parameter of the electromechanical device 1000 is performed by means of a measuring device 10.

As a second method step, S2 of a current operating state of the electromechanical device 1000 is determined on the basis of machine learning with the aid of mass data, preferably in the form of training data, from the detected predetermined operating parameter of the electromechanical switching device 1000 by means of an evaluation device.

Furthermore, it is conceivable to use a control level, so that it should be possible for information to be obtained automatically from a control system or manually from a user as required. Special queries, such as an estimate of the load or the probability of survival in the next week, would be conceivable in this way.

Figure 14:
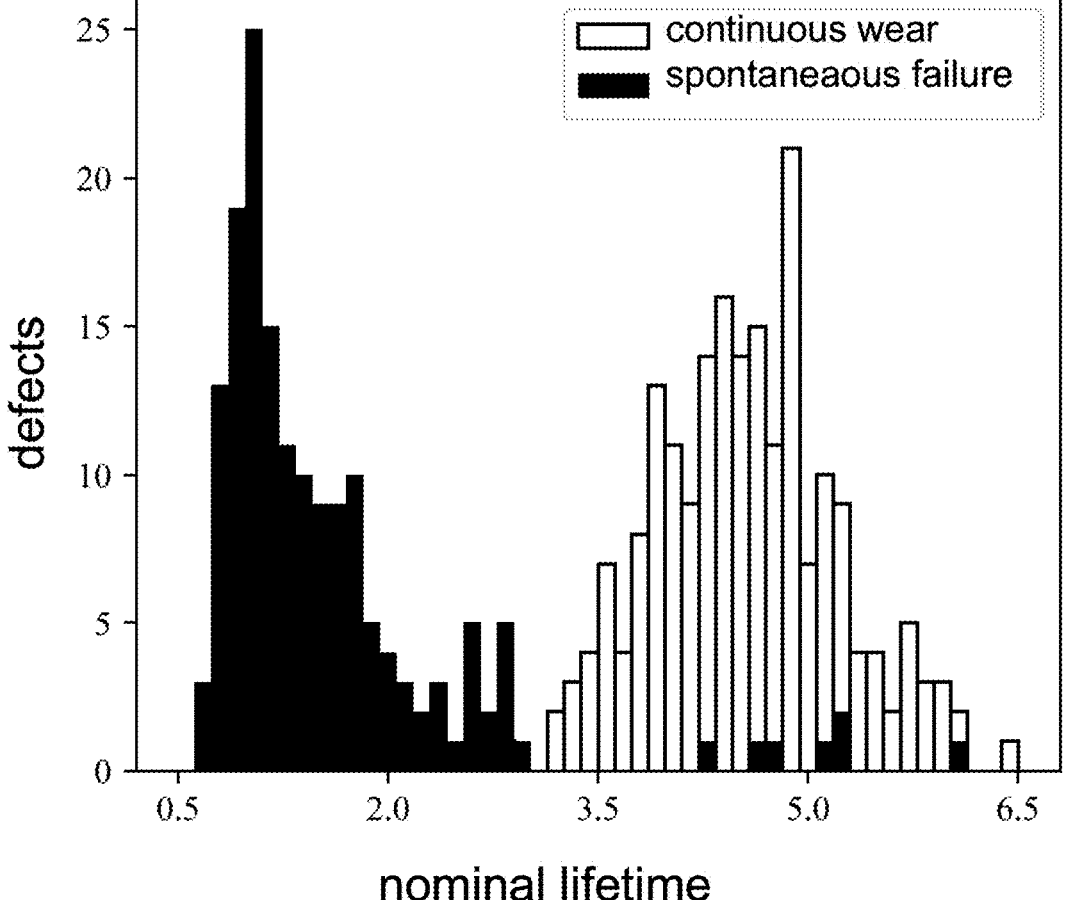
FIG. 14: a schematic diagram of a error distribution or failure distribution of a wear of an electromechanical device according to an embodiment of the present invention.

FIG. 14 shows a schematic representation of a error distribution or failure distribution for a wear of an electromechanical device according to an embodiment of the present invention.

Based on the multimodal error distribution or failure distribution of the electromechanical device shown in FIG. 14, the estimator according to an embodiment of the present invention can be configured in operation to select the following two target values:

i. The remaining usable life, RUL ii. The risk of failure, FR

The RUL of the electromechanical device 1000 is a typical target value in the context of predictive maintenance. Measured data of the operation of the electromechanical device 1000 is used as input and the remaining useful life, RUL, and the risk of failure, FR, of the electromechanical device 1000 are predicted as output.

In the multimodal error distribution or failure distribution shown in FIG. 14, a continuous degeneration of the electromechanical device 1000 and a spontaneous failure of the electromechanical device 1000 are shown according to an embodiment of the present invention.

The depicted failure distribution is often referred to as a bathtub curve and characterizes the multimodal failure or failure distribution, such that the evaluation device 20 is configured to determine the current operating state from the detected predetermined operating parameter via a plurality of target variables, preferably the plurality of target variables corresponding to a multimodal failure distribution.

The underlying data of the multimodal error distribution shown in FIG. 14 can be used as training or bulk data for the training method for training an estimator with operational data on different rates of wear for a device for identifying wear of an electromechanical device.

Although the present invention has been described above with reference to preferred embodiments, it is not limited thereto, but can be modified in a variety of ways. In particular, the invention can be changed or modified in a variety of ways without departing from the essence of the invention.

Supplementally, it should be noted that "comprising" and "comprising" do not exclude other elements or steps, and "one" or "a" do not exclude a plurality.

It should further be noted that features or steps that have been described with reference to any of the above embodiments may also be used in combination with other features or steps of other embodiments described above. Reference signs in the claims are not to be regarded as a limitation.

The invention claimed is:

1. A device for identifying wear of an electromechanical device, the device comprising:

a measuring device which is configured to detect at least one predetermined operating parameter of the electromechanical device; and an evaluation device, which is configured to determine a current operating state of the electromechanical device from the detected predetermined operating parameter of the electromechanical device on the basis of machine learning with the aid of mass data;

wherein the evaluation device is configured to determine the current operating state from the detected predetermined operating parameter assuming a multimodal failure distribution, and wherein the multimodal failure distribution comprises a temporal distribution of defects over a nominal lifetime of the electromechanical device.

2. The device according to claim 1, wherein the evaluation device is configured to use a trained estimator with operating data on different rates of wear for the machine learning and to use the trained estimator for determining the current operating state of the electromechanical device.

3. The device according to claim 2, wherein the estimator is configured as a classification estimator and/or regression estimator.

4. The device according to claim 2, wherein the estimator comprises a deep neural network comprising convolutional layers and/or recurrent layers.

5. The device according to claim 1, wherein the evaluation device is configured to determine the current operating state from the detected predetermined operating parameter via a plurality of target variables.

6. The device according to claim 5, wherein the plurality of target variables correspond to a multimodal failure distribution.

7. The device according to claim 1, wherein the measuring device is further configured to add further information in the form of a time stamp or a counter reading to the detected at least one predetermined operating parameter of the electromechanical device.

8. The device according to claim 1, wherein the measuring device is further configured to continuously detect the operating parameter of the electromechanical device or to detect the operating parameter only upon a switching event of the electromechanical device.

9. The device according to claim 1, wherein the evaluation device is configured to further determine predictions about a future operating state of the electromechanical device.

10. The device according to claim 9, wherein the evaluation device is configured to determine the current operating state or the predictions about the future operating state of the electromechanical device after a time period has elapsed or triggered by a trigger event.

11. The device according to claim 9,
wherein as predictions there is provided:
 a remaining usable lifetime as a relative proportion of the total lifetime of the electromechanical device;
 a remaining usable lifetime as an absolute proportion of use cycles or time of the electromechanical device;
 a risk probability for a spontaneous failure of the electromechanical device;
 a typification of the electromechanical device;
 a coefficient for a load or a classification of a load of the electromechanical device;
 a binary-coded error message;
 a binary-coded operational readiness; and/or
 process-related information of the electromechanical device.

12. The device according to claim 1, wherein the evaluation device is configured to be integrated into a holding device for the electromechanical device.

13. The device according to claim 1, wherein the device further comprises a display device which is configured to display the current operating state of the electromechanical device.

14. The device according to claim 1,
wherein the at least one predetermined operating parameter of the electromechanical device comprises an actuating force, a counterforce, an actuating travel, an overtravel, a switching point, a light pulse, an arc, an acoustic signal, a magnetic field, a temperature, a coil current, a coil voltage, a contact current, a load current or a contact voltage; and/or
 wherein the mass data comprises arbitrary operating parameters, and the arbitrary operating parameters comprise an actuation force, a counterforce, an actuation travel, an overtravel, a switching point, an optical pulse, an arc, an acoustic signal, a magnetic field, a temperature, a coil current, a coil voltage, a contact current, a load current, or a contact voltage of the electromechanical device.

15. The device according to claim 14, wherein the measuring device is configured to detect the arbitrary operating parameters as characteristic curves based on a premeasurement during an initialization phase of the electromechanical device.

16. A training method for training an estimator with operational data on different rates of wear for a device for identifying wear of an electromechanical device according to claim 1.

17. A method for identifying wear of an electromechanical device, the method comprising the following method steps:
 detecting at least one predetermined operating parameter of the electromechanical device by means of a measuring device; and
 determining a current operating state of the electromechanical device by means of machine learning with the aid of mass data from the detected predetermined operating parameter of the electromechanical device by means of an evaluation device;
 wherein the current operating state is determined from the detected predetermined operating parameter assuming a multimodal failure distribution, and
 wherein the multimodal failure distribution comprises a temporal distribution of defects over a nominal lifetime of the electromechanical device.

18. The method according to claim 17, wherein an estimator trained with operating data at different rates of wear is used for the machine learning, and the trained estimator is used for determining the current operating state of the electromechanical device.

19. The method according to claim 18, wherein the estimator is configured as a classification and/or regression estimator.

* * * * *